United States Patent [19]

Bockelman et al.

[11] Patent Number: 5,459,284
[45] Date of Patent: Oct. 17, 1995

[54] TWISTED-PAIR WIRE BOND AND METHOD THEREOF

[75] Inventors: David E. Bockelman, Plantation; Douglas H. Weisman, Sunrise, both of Fla.

[73] Assignee: Motorola, Inc., Schaumburg, Ill.

[21] Appl. No.: 299,857

[22] Filed: Sep. 1, 1994

Related U.S. Application Data

[63] Continuation of Ser. No. 115,174, Aug. 31, 1993, abandoned.

[51] Int. Cl.6 .......................... H01B 11/02; H01R 43/00
[52] U.S. Cl. .................. 174/34; 174/36; 174/27; 29/825
[58] Field of Search ............... 174/32–34, 36, 174/27; 29/825, 831–832, 850, 854, 868–869, 877–879; 361/826–827

[56] References Cited

U.S. PATENT DOCUMENTS

| | | | |
|---|---|---|---|
| 3,486,076 | 12/1969 | Abbott et al. | 361/777 |
| 3,643,133 | 2/1972 | Towell | 361/777 |
| 3,644,792 | 2/1972 | Fields | 361/777 |
| 3,662,367 | 5/1972 | De Veau, Jr. et al. | 174/34 |
| 3,981,076 | 9/1976 | Nicolas | 361/777 |
| 4,034,148 | 7/1977 | Lang | 174/34 |
| 4,313,149 | 1/1982 | Hirose et al. | 361/826 |
| 4,381,426 | 4/1983 | Cronkite et al. | 174/34 |
| 4,404,424 | 9/1983 | King et al. | 174/34 |
| 4,626,889 | 12/1986 | Yamamoto et al. | |
| 4,686,492 | 8/1987 | Grellmann et al. | 333/33 |
| 4,825,155 | 4/1989 | Takamine | 324/158 F |
| 4,831,497 | 5/1989 | Webster et al. | |
| 4,837,405 | 6/1989 | Bonjour et al. | 74/36 |
| 5,039,824 | 8/1991 | Takashima et al. | 174/33 |
| 5,142,105 | 8/1992 | Kihlken et al. | 174/36 |
| 5,221,895 | 6/1993 | Janko et al. | 324/158 P |

FOREIGN PATENT DOCUMENTS

| | | | |
|---|---|---|---|
| 0562227 | 6/1960 | Belgium | 174/268 |
| 2709129 | 8/1978 | Germany | 174/34 |

*Primary Examiner*—Bot L. Ledynh
*Attorney, Agent, or Firm*—Frank M. Scutch, III; Juliana Agon

[57] ABSTRACT

A radio frequency electrical connection between a pair of electrical devices (101, 104) is formed by a pair of bond wires (102, 103) crossing (401) each other.

4 Claims, 2 Drawing Sheets

5,459,284

TWISTED-PAIR WIRE BOND AND METHOD THEREOF

This is a continuation of application Ser. No. 08/115,174, filed Aug. 31, 1993, now abandoned.

CROSS REFERENCE TO RELATED APPLICATIONS

This application is related to the following U.S. applications: U.S. application Ser. No. 08/115,175 by David E. Bockelman and Douglas H. Weisman, entitled "A Horizontally Twisted-Pair Planar Conductor Line Structure," U.S. application Ser. No. 08/115,368 by David E. Bockelman, entitled "A Vertically Twisted-Pair Conductor Line Structure," to U.S. application Ser. No. 08/115,176 by David E. Bockelman, entitled "A Twisted-Pair Planar Conductor Line Off-Set Structure," and to U.S. application Ser. No. 08/115,291 by David E. Bockelman and Robert E. Stengel, entitled "Interconnection Structure for Crosstalk Reduction to Improve Off-Chip Selectivity," all filed concurrently herewith and all assigned to Motorola, Inc.

BACKGROUND

This invention relates to miniaturized circuits and more particularly to the interconnection of these circuits on different electrical devices, such as semiconductor devices, by means of a bond wire connection.

Small integrated circuit (IC) elements, dies, or chips, such as a radio frequency (RF) amplifier on a radio chip are sometimes connected to an off-chip device such as another semiconductor or a hybrid integrated circuit, for example an off-chip filter, by wire bonding. The wire bonding technique uses a wire bonding machine to fuse small wires to the contact points or bond pads of these small IC chips.

In hybrid IC chips, one or more chips or devices may be carried by a ceramic substrate. For example, high frequency such as radio frequency (RF) signals can be transmitted via a transmission line structure formed on one of the devices, such as on a surface acoustical wave (SAW) filter from another device, such as a chip containing radio circuitry. A transmission line is usually formed by any two conductors or wires, insulated from each other. In this case, the radio chip containing the on-chip radio circuitry may be smaller than the off-chip SAW device.

It is at the interface between the transmission line of the off-chip device and the small die that the bond wire connection is made. The transmission line of the off-chip device is fully capable of handling radio frequencies, but a crosstalk problem is encountered, for example, when attempting to connect the IC die to the off-chip transmission line.

When any two or more circuits are interconnected on different electrical devices having substrates, such as printed circuit boards, semiconductor integrated circuits (ICs) or other types of carriers, by a wire-bond transmission line, a certain amount of signal from one circuit may couple into an otherwise isolated circuit. The resulting induced signal is called crosstalk. This crosstalk situation can occur, when a signal, on one substrate, is transmitted to a subsequent circuit, on another substrate, across the wire-bond conductors. For example, in a radio transceiver, when a high frequency signal source, such as an antenna received radio frequency (RF) signal is routed from an RF amplifier in one substrate, to an RF filter, in another substrate, crosstalk can occur. In the other direction, during the coupling of a generated signal from a modulator, on the first or a third substrate, to a transmitter filter, in a fourth substrate, in the same radio, undesired crosstalk coupling can degrade the performance of the radio transceiver. Moreover, transmitter signals may undesirably couple into the receiver.

If one of the two conductors of the transmission line coupling the circuits is used as a grounding conductor, the circuit is referenced as single-ended and the transmission line is a single-ended transmission line.

Otherwise, two non-grounded conductors form a differential transmission line for a differential circuit. The geometry of the two conductors, and their relative positions, are set to establish a characteristic impedance to properly match the impedance from the first differential circuit to the subsequent differential circuit. A differential signal is applied across the two conductors by one differential generating circuit, and the signal travels down the transmission line to the differential receiving circuit, where the signal is measured as the difference between the two conductors. In other words, a differential circuit generates or receives a pair of complementary signals in a phase-inverted relation with each other, known together as a single differential signal.

The substitution of a differential wire bond transmission line for a wire bond single-ended transmission line can greatly reduce one type of crosstalk coupling called common-mode impedance coupling. Common-mode impedance coupling in a single-ended (non-differential) transmission line is caused by a non-zero parasitic impedance, generally called a ground-return resistance, that is unintentionally shared by two or more otherwise isolated circuits. This common impedance causes crosstalk. Therefore, by reducing the common or shared impedance of the ground conductor with a non-grounded conductor, common-mode impedance coupling is reduced.

In addition to common impedance coupling between circuits, there could also be capacitive (electric) and inductive (magnetic) coupling between the two conductors of the same transmission line if the two conductors are close together.

In the case of two adjacent transmission lines, differential transmission lines can also reduce the capacitive, or electric field, coupling and inductive, or magnetic field, coupling between the differential transmission lines, relative to single-ended transmission lines, if the distance between the two transmission lines is much larger than the separation between the conductors of one of the transmission lines. However, space is generally limited in these miniaturized applications, such as in a radio. Therefore, these differential transmission lines must be close together. This close situation increases the magnetic coupling and decreases the advantage of differential lines over single-ended lines.

A further reduction in crosstalk, over the plain differential line, for the two close conductors of the same differential line or for two close differential lines, can be achieved by twisting the two conductors to form a twisted-pair differential transmission line. This type of line is commonly implemented with two insulated round wires which are twisted about each other. This type of line can reduce crosstalk by reducing the inductive, or magnetic field, coupling. The crosstalk reduction is achieved by reducing the magnetic loop area of the line, and by changing the orientation of the magnetic field continuously over the length of the line.

An un-twisted pair defines a magnetic, or current, loop area over the entire length of the differential transmission line, with the wires being the long sides of a "rectangle". The area of such a loop defines the amount of current that can be induced in the wires by an external magnetic field, such as from an adjacent conductor.

By twisting the wires together, the loop area is minimized. The dimensions of the wire, and the number of twists per inch define the transmission lines characteristic impedance. Furthermore, the remaining loop is now twisted down the length of the transmission line, so that the normal to the magnetic loop area traces a spiral. When two such twisted pair lines are placed close together, the spiraling normals of the twists reduce the ability for the magnetic fields of one pair to induce a current in the other, such as from the modulator to the amplifier, if the circuits are closely spaced.

When interconnecting miniature circuits, such as printed circuits on a printed circuit board or a flexible circuit substrate, integrated circuits (ICs) on a semiconductor substrate, or hybrid circuits, the concept of twisted-pair differential transmission lines can be applied to reduce crosstalk. However, when connecting miniature circuits on two separate substrates with typical wire bonds, all the interconnections between substrates, even if the circuits are differential, are implemented by bond wires that are substantially parallel, and these parallel interconnections can lead to significant crosstalk.

DETAILED DESCRIPTION OF THE PREFERRED EMBODIMENT

Figure 1:
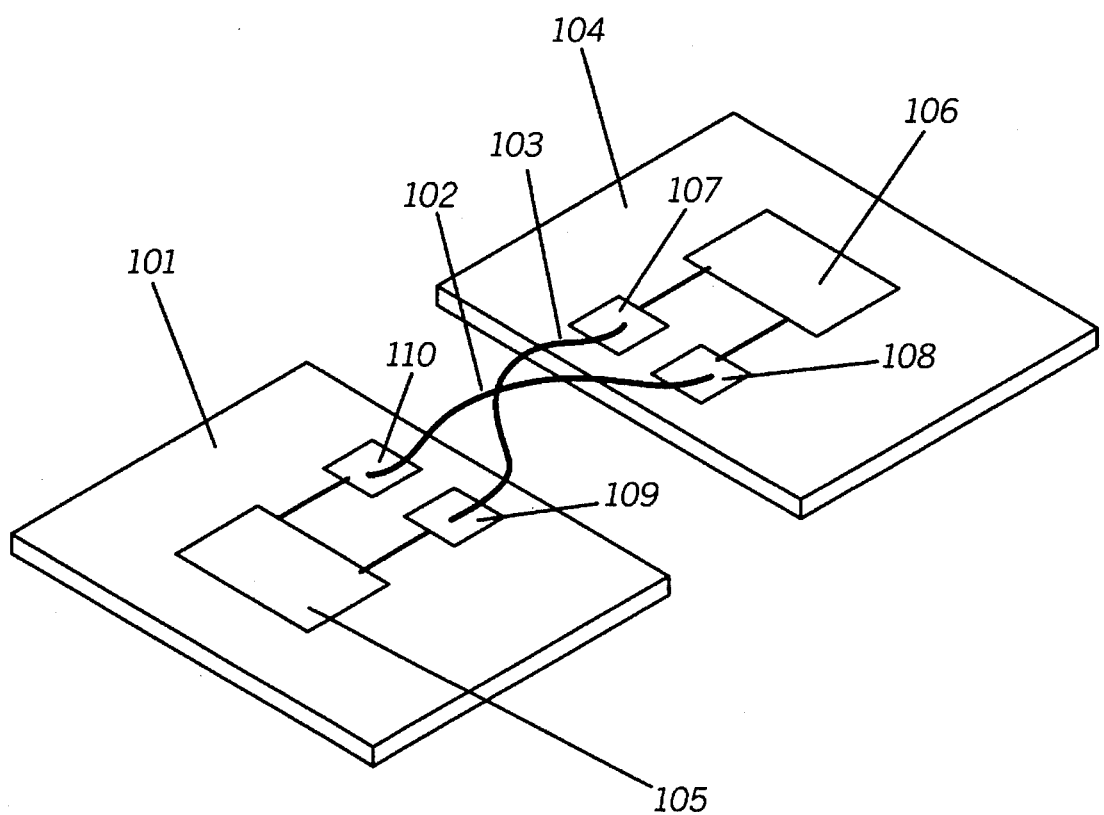
FIG. 1 is a schematic perspective view of a twisted-pair wire bond connection having one twist, in accordance with the present invention.
Figure 2:
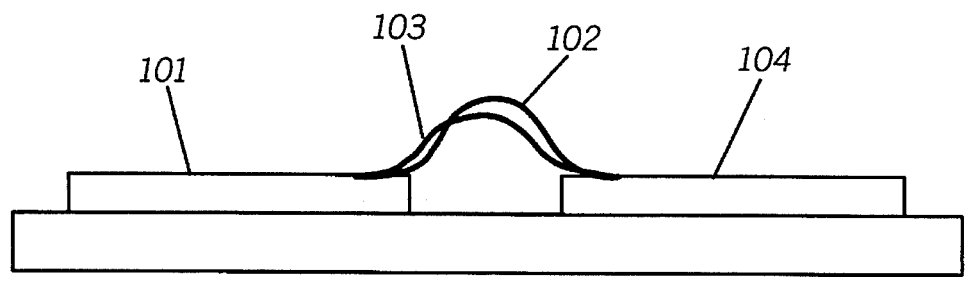
FIG. 2 is a side view of the twist of FIG. 1 located on top of a carrier substrate.

Referring to FIG. 1, a twisted pair of wire bonds is shown connecting any two electrical devices. This twisted wire-bond pair is an approximation to the true twisted pair of two insulated round wires because the bond wires 102 and 103 are uninsulated bonding wires, twisted once in accordance with the present invention. The wires 102 and 103 are attached to the two electrical devices, such as substrates 101 and 104 through any appropriate bonding method. The wires 102 and 103 connect the two miniaturized differential circuits 105 and 106 through contact points, bonding areas, or pads 107, 108, 109 and 110. A first wire 103 is attached first in a generally curvilinear path. Then, a second wire 102 is curvilinearly attached so as to cross over or traverse the first wire 103 without touching. This crossing of the wires 102 and 103 is shown in FIG. 2, from a different perspective. In this case, the bottom common carrier could be a ceramic or a printed circuit substrate of a hybrid for carrying an off-chip filter and a radio die.

Figure 3:
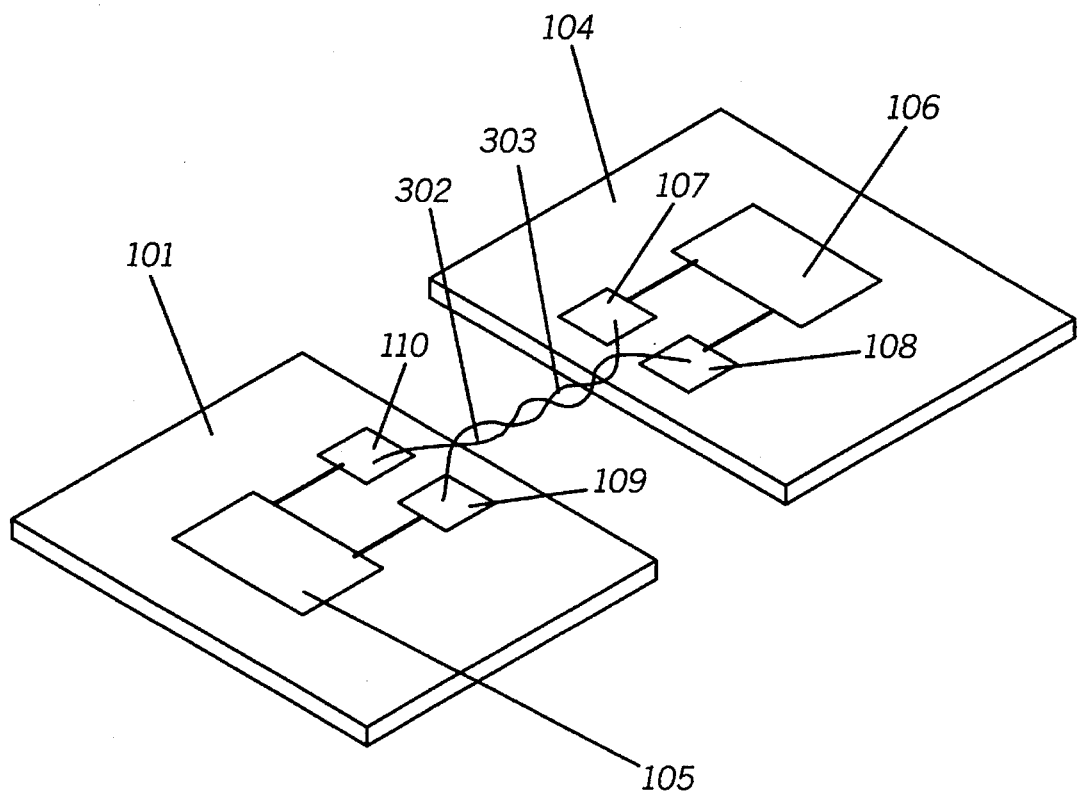
FIG. 3 is a schematic perspective view of a twisted-pair wire bond connection having multiple twists, in accordance with the present invention.

Referring to FIG. 3, two wires 302 and 303 are twisted together in intimate contact, with multiple twists, in another embodiment. Each bond wire 302, 303 follows a predetermined spiraling path, such that the pair of bond wires are substantially helically wound in opposed directions. At least one wire 303, and optionally both wires, must be sheathed with electrical insulation over the twisted portion of the wire bonds. Additionally, such bonding wire as used in FIG. 3 can be manufactured for applying large numbers of twisted pair wire bonds easily.

Figure 4:
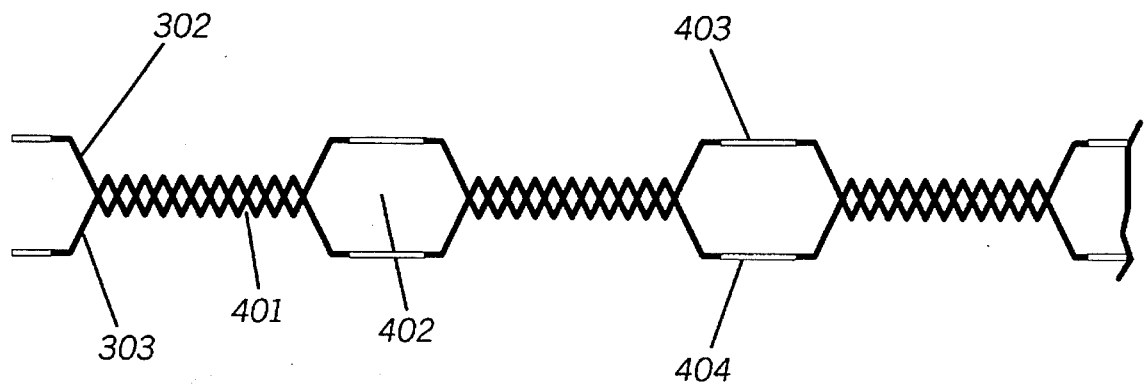
FIG. 4 is a top view of a pre-formed twisted pair wire bond structure, in accordance with the present invention, for connecting the two substrates of FIG. 3.

Referring to FIG. 4, a length of pre-twisted bonding wire is shown which could be on a spool for a bonding machine. The wires 302 and 303 are now both electrically insulated, and are twisted together with a controlled number of twists per inch to achieve a true twisted pair. The wires 302 and 303 are twisted together over a predetermined length 401 which corresponds to the length of a standard wire-bond length. The two wires 302 and 303 are then held apart by a specified separation for a certain length of wire to form a parallel section 402 where the wires are held substantially parallel. The separation between the wires 302 and 303 correspond to the center-to-center spacing between the bond pads 107 and 108 or between the pads 109 and 110. This process of twisting and holding apart is repeated periodically over the entire length of the wires to form a pre-twisted two-wire structure having alternating insulated twisted sections 401 and successive parallel sections 402.

This pre-twisted wire can be bonded in several fashions. Physically the wires are bonded to the set of contact pads of each electrical devices by a wire-bonding machine. One method requires that the parallel sections 402 have uninsulated sections of wire 403 and 404 for bonding. With these uninsulated sections 403 and 404, the pre-twisted wire may be bonded with a wedge bonding apparatus. The uninsulated sections 403 and 404 can be formed in the manufacturing of the twisted pair bonding wire either by selectively removing the insulation or by selectively applying the insulation.

Another bonding technique that can be used on the pre-twisted wire of FIG. 4 and applied to FIG. 3, does not require the pre-formed uninsulated sections 403 and 404. This method starts with electrical insulation disposed on the wires 302 and 303 that is scrubbed away during the bonding process. The insulated wires are positioned over the bonding pads 107–110 on the substrates 101 and 106 and a bonding tool applies pressure to one or both of the wires. Simultaneously, the bonding tool oscillates in the horizontal plane. This contact between the ends of the wires 302 and 303 and their respective bonding pads 107, 108, 109, 110 cause the insulation on the wires to be scrubbed away. If the desired mode of oscillation is ultrasonic, a typical ultrasonic ball bonding machine can be used to apply the pre-twisted wire bond to the substrates.

What is claimed is:

1. A twisted pair structure used for reducing electrical coupling between at least two adjacent components comprising:

first and second freestanding bond wires which are positioned substantially parallel to form at least one twisted section and at least one substantially parallel section; and each of said at least one twisted section utilizes insulated wires having a predetermined length, and further where each of said at least one substantially parallel section utilizes uninsulated wires and defines a portion of said twisted pair structure where said first and second wires are separated by a predetermined distance for facilitating connection to an electrical device, wherein at least one uninsulated section of said at least one substantially parallel section is between the ends of the twisted pair structure.

2. A twisted pair device as in claim 1 wherein said at least one twisted section has multiple twists forming a helical shape.

3. A twisted pair device as in claim 1 wherein said device has a predetermined length and further were a plurality of twisted sections and parallel sections alternate over said predetermined length.

4. A method of forming a twisted pair device used in a radio frequency electrical connection for reducing crosstalk and aiding in making a connection to an electrical device comprising the steps of:

positioning a first insulated wire and a second insulated wire in parallel; and arranging said first wire and said second wire to form a plurality of twisted sections and a plurality of parallel sections, where said twisted sections form a helical twist and said parallel sections define an area where said first and wires are substantially in parallel, uninsulated and separated by a predetermined distance, wherein at least one uninsulated section of said parallel sections is between the ends of the twisted pair device.

* * * * *